(12) United States Patent
Bulovic et al.

(10) Patent No.: US 12,245,394 B2
(45) Date of Patent: Mar. 4, 2025

(54) POWER CONVERTER ARRANGEMENT

(71) Applicant: SEMIKRON ELEKTRONIK GMBH & CO. KG, Nuremberg (DE)

(72) Inventors: Sandro Bulovic, Langenzenn (DE); Christian Zeiler, Pmmersfelden (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 198 days.

(21) Appl. No.: 18/097,949

(22) Filed: Jan. 17, 2023

(65) Prior Publication Data
US 2023/0240035 A1   Jul. 27, 2023

(30) Foreign Application Priority Data
Jan. 24, 2022   (DE) ..................... 10 2022 101 510.6

(51) Int. Cl.
H05K 7/14   (2006.01)
H05K 7/20   (2006.01)

(52) U.S. Cl.
CPC ....... *H05K 7/1432* (2013.01); *H05K 7/20272* (2013.01); *H05K 7/20927* (2013.01)

(58) Field of Classification Search
None
See application file for complete search history.

(56) References Cited

U.S. PATENT DOCUMENTS

| | | | | |
|---|---|---|---|---|
| 5,091,823 A * | 2/1992 | Kanbara | .............. | H05K 9/0022 361/736 |
| 7,515,422 B2 * | 4/2009 | Hirota | ................... | H02M 7/003 361/709 |
| 8,169,780 B2 * | 5/2012 | Yoshino | ............. | H05K 7/20927 361/689 |
| 9,076,593 B2 * | 7/2015 | Sharaf | ...................... | H01G 2/08 |
| 9,350,228 B2 * | 5/2016 | Uetake | ............... | H05K 7/14329 |

(Continued)

FOREIGN PATENT DOCUMENTS

| CN | 108630643 A | 10/2018 |
|---|---|---|
| CN | 109462210 A | 3/2019 |

(Continued)

OTHER PUBLICATIONS

DE 10 2022 101 510.6, Examination Report dated Sep. 28, 2022, 7 pages—German, 7 pages—English.

*Primary Examiner* — Xanthia C Relford
(74) *Attorney, Agent, or Firm* — Andrew F. Young; NOLTE LACKENBACH SIEGEL

(57) ABSTRACT

An electronic power converter is in a housing of a power converter arrangement. A cooling duct for cooling the power converter with a cooling liquid is inside the housing. The cooling duct has a connection supplying the cooling liquid to the cooling duct and for discharging. Mating connections are connected to the connections of the cooling duct. The connections and the mating connections have sealing surfaces which face each other. The interior of the housing and the cooling duct is sealed via sealing devices each have two sealing rings spaced apart from each other. First sealing rings seal the cooling duct and the other sealing rings seal the housing. Annular grooves as outflow ducts in the housing lead off and open out on the outside of the housing and are introduced into the sealing surfaces in the region between the sealing rings.

7 Claims, 3 Drawing Sheets

(56) References Cited

U.S. PATENT DOCUMENTS

| | | | |
|---|---|---|---|
| 9,362,040 B2* | 6/2016 | Rai | H05K 7/20927 |
| 9,888,617 B2* | 2/2018 | Ishiyama | H01L 23/473 |
| 10,136,527 B2* | 11/2018 | You | H05K 5/0026 |
| 10,264,705 B2* | 4/2019 | Nakamura | H05K 5/0217 |
| 10,321,585 B2* | 6/2019 | Nakatsu | H05K 5/0043 |
| 2014/0313806 A1* | 10/2014 | Shinohara | H01L 23/473 |
| | | | 363/141 |
| 2021/0204442 A1* | 7/2021 | Bittnerr | H01G 2/08 |
| 2023/0200030 A1* | 6/2023 | Bulovic | H05K 7/20927 |
| | | | 361/702 |

FOREIGN PATENT DOCUMENTS

| | | |
|---|---|---|
| DE | 102018110360 A1 | 1/2019 |
| EP | 1887847 A1 | 2/2008 |
| JP | 2002-315357 A | 10/2002 |
| JP | 200533140 A | 2/2005 |

* cited by examiner

POWER CONVERTER ARRANGEMENT

CROSS REFERENCE TO RELATED APPLICATIONS

This application relates to and claims priority to DE 10 2022 101 510.6 filed Jan. 24, 2022, the entire contents of which are incorporated herein fully by reference.

FIGURE SELECTED FOR PUBLICATION

FIG. 3.

BACKGROUND OF THE INVENTION

Field of the Invention

The present invention relates to a power converter arrangement,
wherein the power converter arrangement has a housing in which an electronic power converter is arranged,
wherein a cooling duct for cooling the power converter with a cooling liquid is arranged inside the housing,
wherein the cooling duct has in each case a connection for supplying the cooling liquid to the cooling duct and for discharging the cooling liquid from the cooling duct,
wherein the housing has two mating connections which are connected to in each case one of the connections of the cooling duct,
wherein the connections and the mating connections have sealing surfaces which face each other, and
wherein the interior of the housing and the cooling duct is sealed liquidtightly via respective sealing devices arranged in the region of the respective sealing surfaces.

Description of the Related Art

Power converter arrangements are generally known. They are widely used in the power electronics sector, for example in commercial vehicles for supplying their traction drives with electrical energy. In particular in this use case but also in many other use cases, the interior of the housing must be sealed liquidtightly both relative to the cooling channel and also relative to the surroundings of the housing. This is ensured by the sealing devices.

Conventional power converter arrangements work generally satisfactorily in their approach. However, if one of the sealing devices is not leaktight (for example, because a sealing ring ruptures), the cooling liquid can penetrate the interior of the housing and dust, oil, humidity, etc. from the surroundings of the housing furthermore penetrate the interior of the housing. Considerable damage and financial loss can be caused to the electronics as a result.

ASPECTS AND OBJECTS OF THE INVENTION

The object of the present invention consists in further developing a power converter arrangement of the type mentioned in such a way that penetration of the cooling liquid into the interior of the housing can be avoided with almost complete certainty and the housing is furthermore also protected from penetration of dust, dirt and the like from the surroundings of the housing into the interior.

The object is achieved by a power converter arrangement with the features as claimed and shown herein.

According to alternative aspects and objects of the present invention, a power converter arrangement of the type mentioned at the beginning is configured such that:
the sealing devices each have two sealing rings,
the two sealing rings of a respective sealing device are spaced apart from each other geometrically,
one sealing ring of a respective sealing device seals the cooling duct liquidtightly and the other sealing ring of a respective sealing device seals the housing liquidtightly, and
a respective annular groove, from which a respective outflow duct introduced into the housing leads off and opens out on the outside of the housing, is introduced into the sealing surfaces in the region between the sealing rings of the respective sealing device.

The two functions of the respective sealing device are shared by the two sealing rings. It is consequently achieved that, in the event of one of the two sealing rings failing, the interior of the housing and hence also the electronic power converter still remain protected from the cooling liquid. If the sealing ring sealing the cooling duct fails, although the cooling liquid can escape from the cooling duct, the cooling liquid is drained off to the outside via the annular groove and the outflow duct. As a result, in some circumstances it can even be detected by simple visual inspection that lack of tightness has occurred. Furthermore, as a result no pressure can build up between the two sealing rings. Furthermore, a lack of tightness, for example because of a drop in the pressure of the cooling liquid, can be detected. However, the sealing ring sealing the housing furthermore ensures liquidtight sealing of the housing. If, conversely, the sealing ring sealing the housing fails, the cooling liquid can also not penetrate the interior of the housing because the liquidtight closure remains ensured, as before, by the sealing ring sealing the cooling duct. The (extremely unlikely) situation in which both sealing rings fail is likewise relatively unproblematic because the cooling liquid can flow out via the outflow duct in this case too and hence is not pressed into the interior of the housing under pressure.

Generally, one sealing ring is arranged closer to the cooling duct and the other sealing ring closer to the inside of the housing. This is the case at least in the sense of the route that the cooling liquid has to take in order to be able to flow along the sealing surfaces from the cooling duct to the interior of the housing.

The cooling liquid has a direction of flow at the transition from each of the connections to each of the mating connections or vice versa. It is possible that the sealing surfaces are oriented (at least essentially) parallel to the direction of flow. Alternatively, it is possible that the sealing surfaces are oriented (at least essentially) orthogonally to the direction of flow. The latter approach is generally preferred.

If the sealing surfaces are oriented (at least essentially) orthogonally to the direction of flow, the sealing rings of each sealing device can lie within the same plane. Alternatively, they can lie within different planes. Both approaches are equally valid.

At least one sensor device, by means of which a sensor signal which is characteristic for the humidity in the interior of the housing and/or penetration of the cooling liquid into the housing can be detected, is preferably arranged inside the housing. As a result, in the rare exceptional cases in which moisture and/or cooling liquid does penetrate into the interior of the housing, a protective measure can be taken in good time, i.e., in particular before damage is caused to the electronic power converter.

The above and other aspects, features, objects, and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
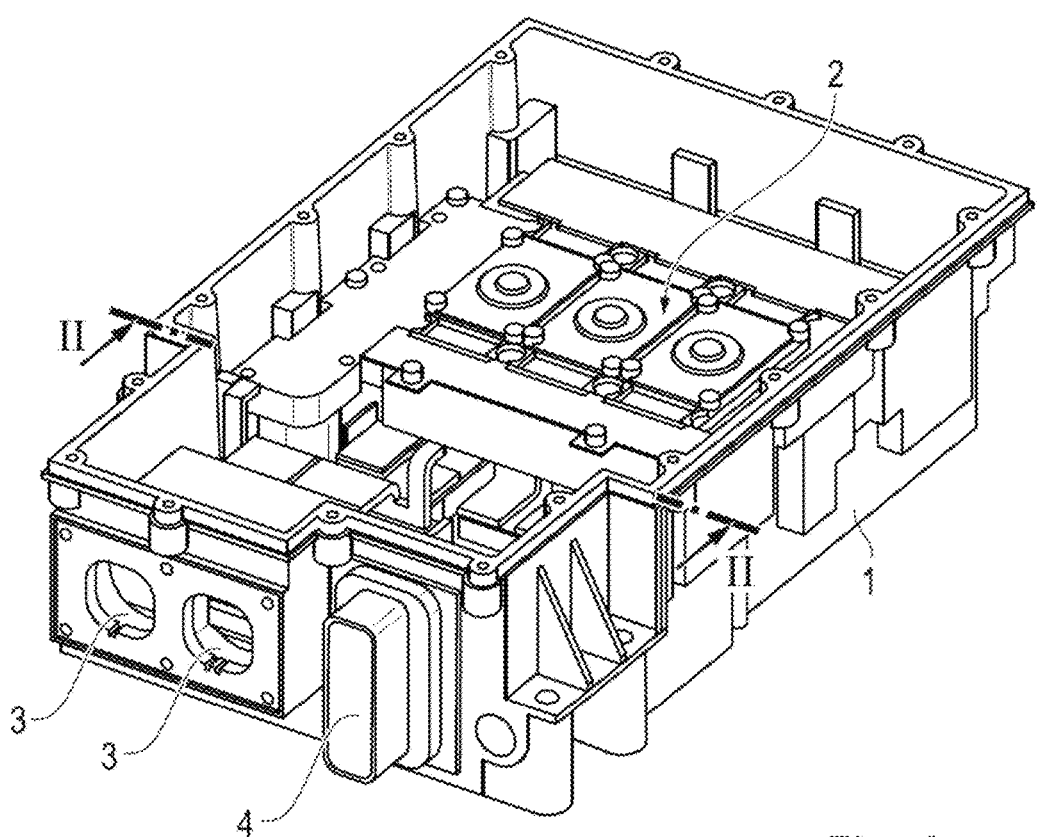
FIG. 1 shows a perspective illustration of a power converter arrangement.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Figure 2:
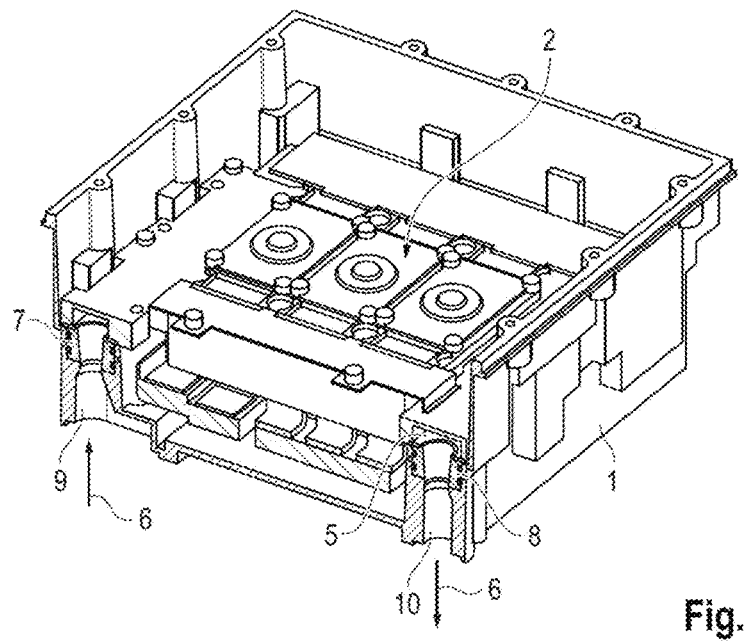
FIG. 2 shows a perspective illustration of a section along a plane II in FIG. 1.

According to FIGS. 1 and 2, a power converter arrangement has a housing 1. The housing 1 can be made, for example, from a plastic (in particular an impact-resistant plastic) or from metal (for example, steel or aluminum). The housing 1 is completely closed when in operation. However, the housing 1 is illustrated in FIGS. 1 and 2 without a cover in order to be able to provide a view of the interior of the housing 1.

An electronic power converter 2 is arranged in the housing 1. In order to supply and emit the electrical load currents, the housing 1 can have passage openings 3 via which corresponding cables (not illustrated) can pass into the interior of the housing 1 and be connected there. The housing 1 can have a pre-assembled plug connection 4 for supplying control signals and emitting sensor signals.

The power converter 2 comprises power semiconductors, for example IGBTs or MOSFETs. The power semiconductors are not illustrated in the Figures. A power loss occurs during operation of the power converter 2, essentially in accordance with the product of the forward voltage of a semiconductor switch and the load current conducted by the power semiconductor. It is entirely possible for the power loss to be in the region of 100 W or more. The power converter 2 therefore heats up. In order to keep the heating of the power converter 2 within an acceptable range, a cooling duct 5 is arranged inside the housing 1. A cooling liquid 6, by means of which the power converter 2 is cooled, flows in the cooling duct 5. The cooling liquid 6 can in particular be water or water-based.

The cooling duct 5 has a connection 7 via which the cooling liquid 6 is supplied to the cooling duct 5. The cooling duct 5 furthermore has a connection 8 via which the cooling liquid 6 is discharged from the cooling duct 5. The housing 1 in turn has two mating connections 9, 10. One mating connection 9 is connected to the connection 7 and the other mating connection is connected to the connection 8.

The structure and operating principle of the connections 7, 8 and the mating connections 9, 10 will be explained below in particular in conjunction with FIG. 3 for the connection 7 and the mating connection 9. Similar explanations apply for the connection 8 and the mating connection 10.

Figure 3:
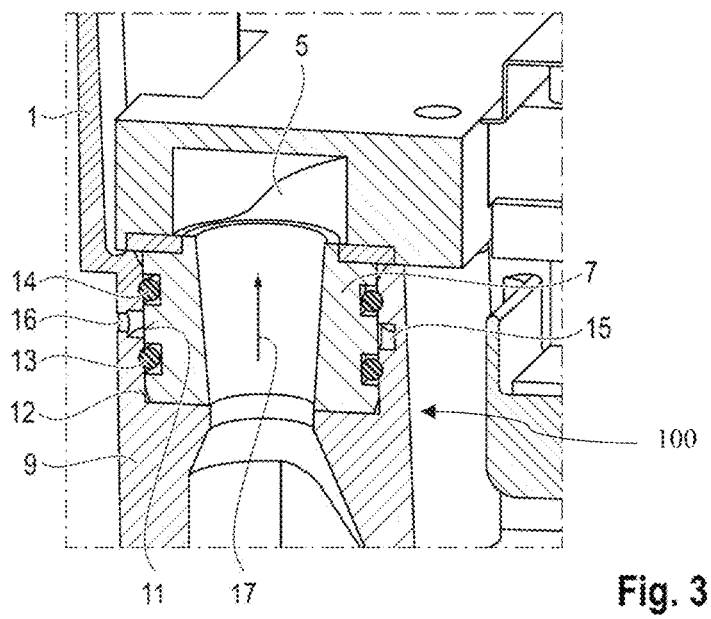
FIG. 3 shows a detail from FIG. 2.

According to FIG. 3, the connection 7 and the mating connection 9 have sealing surfaces 11, 12. A sealing device 100, via which the interior of the housing 1 and the cooling duct 5 is sealed liquidtightly, is arranged in the region of the sealing surfaces 11, 12. The configuration of the sealing device (and also of the corresponding sealing device for the connection 8 and the mating connection 10) is the core subject-matter of the present invention.

According to FIG. 3, the sealing device 100 has two sealing rings 13, 14. The sealing rings 13, 14 can be designed, for example, as O-rings. The two sealing rings 13, 14 are spaced apart from each other geometrically. Generally, the sealing ring 13 is arranged closer to the cooling duct 5 and the sealing ring 14 closer to the interior of the housing 1. The sealing ring 13 seals the cooling duct 5 liquidtightly in the region of the sealing surfaces 11, 12. Similarly, the sealing ring 14 seals the housing 1 liquidtightly in the region of the sealing surfaces 11, 12.

According to FIG. 3, an annular groove 15 is introduced into the sealing surface 12 in the region between the sealing rings 13, 14. The annular groove 15 could, however, equally also be introduced into the sealing surface 11. It would also be possible to introduce an annular groove in each case into both sealing surfaces 11, 12, which together form a resulting annular groove. Irrespective of the specific configuration, an outflow duct 16 is, however, introduced into the housing 1 and leads off from the annular groove 15 and opens out on the outside of the housing 1. The outflow duct 16 can be designed, for example, as a bore. It can, however, also be introduced into the housing 1 in a different fashion.

The cooling liquid 6 has a direction of flow 17 at the transition from the connection 7 to the mating connection 9. In the embodiment according to FIGS. 1 to 3, the sealing surfaces 11, 12 are oriented parallel or at least essentially parallel to the direction of flow 17. "Essentially parallel" is a deviation of no more than 15°. Usually the deviation, if present at all, is even 10° or less, in particular 5° or less. According to FIG. 3, the sealing surfaces 11, 12 run cylindrically around the direction of flow 17.

Figure 4:
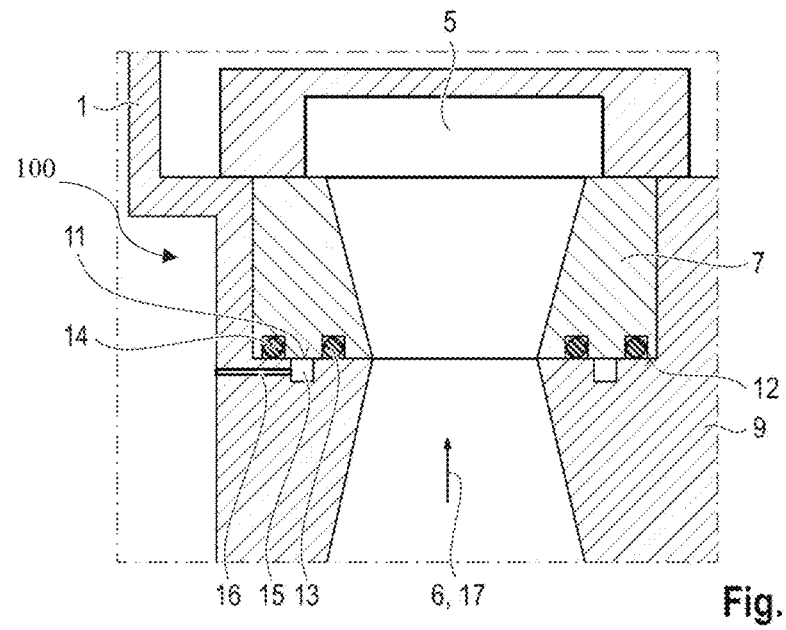
FIG. 4 shows an alternative embodiment to that in FIG. 3.

FIG. 4 shows an alternative embodiment to that in FIG. 3. The difference consists essentially in that the sealing surfaces 11, 12 are not oriented parallel or at least essentially parallel to the direction of flow 17 and instead are oriented orthogonally or at least essentially orthogonally to the direction of flow 17. As above, the term "essentially orthogonally" means a deviation of no more than 15°. Usually the deviation, if present at all, is even 10° or less, in particular 5° or less. According to FIG. 4, the sealing surfaces 11, 12 are plane surfaces which are oriented exactly orthogonally to the direction of flow 17. Otherwise, the explanations of FIGS. 1 to 3 apply.

Figure 5:
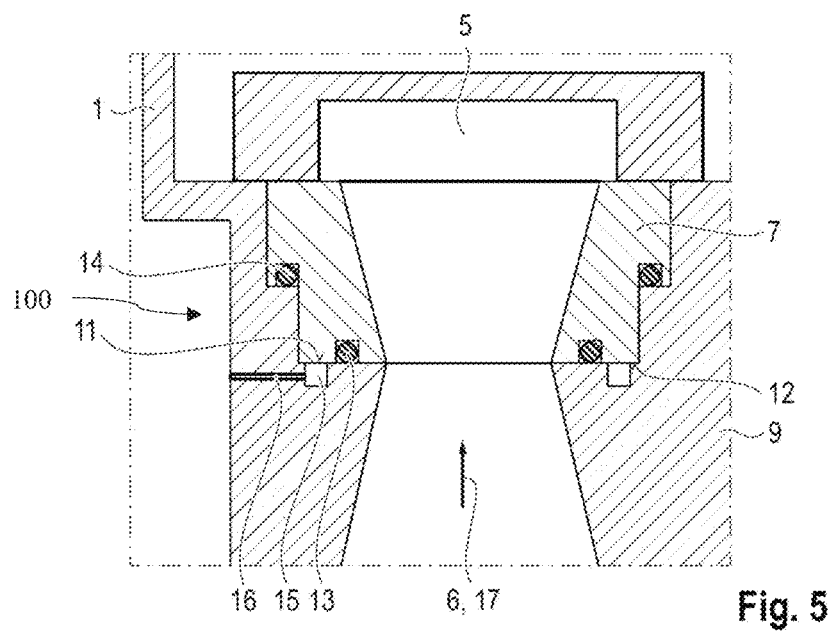
FIG. 5 shows an alternative embodiment to that in FIG. 4.

In the embodiment according to FIG. 4, the sealing rings 11, 12 lie within the same plane. Alternatively, according to the illustration in FIG. 5, it is possible that the sealing rings 11, 12 lie in different planes. Otherwise, the explanations of FIG. 4 apply.

It is possible that (at least) one sensor device is arranged inside the housing 1. For example, a sensor signal which is characteristic for the humidity in the interior of the housing 1 can be detected by means of the sensor device, if present. It is generally sufficient for detecting the humidity if a single sensor device is present, wherein the sensor device can be arranged as required and wherever possible. Alternatively, or additionally, for example, penetration of the cooling liquid 6 into the housing 1 can be detected by means of the sensor device. A separate sensor device is arranged in each case preferably in the region of the connections 7, 8 for detecting the penetration of the cooling liquid 6 into the housing 1. The sensor signal of the sensor device can, in particular via the already mentioned preassembled plug connection 4, be passed to the outside and tapped there.

The present invention has many advantages. The most important one is that the whole construction is simple, cost-effective and reliable and also offers a high degree of operational safety in continuous operation.

The above description serves only to explain the present invention. However, the scope of protection of the present invention is to be determined only by the attached claims.

LIST OF REFERENCE SIGNS 1 housing
2 power converter
3 passage openings
4 plug connection
5 cooling duct
6 cooling liquid
7, 8 connections
9, 10 mating connections
11, 12 sealing surfaces
13, 14 sealing rings
15 annular groove
16 outflow duct
17 direction of flow Also, the inventors intend that only those claims which use the specific and exact phrase "means for" are intended to be interpreted under 35 USC 112. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power converter arrangement, comprising:
a housing in which an electronic power converter is arranged;
a cooling duct for cooling the power converter with a cooling liquid is arranged inside the housing;
the cooling duct has a connection respectively for supplying the cooling liquid to the cooling duct and for discharging the cooling liquid from the cooling duct;
the housing has two mating connections which are connected to in each case one of the connections of the cooling duct;
the connections and the mating connections have sealing surfaces which face each other;
the interior of the housing and the cooling duct are sealed liquidtightly via respective sealing devices arranged in the region of the respective sealing surfaces;
wherein
the sealing devices each have two sealing rings;
the two sealing rings of a respective sealing device are spaced apart from each other geometrically;
one sealing ring of a respective sealing device seals the cooling duct liquidtightly and the other sealing ring of a respective sealing device seals the housing liquidtightly; and
wherein a respective annular groove is introduced into the sealing surfaces in the region between the respective sealing rings of the respective sealing device from which a respective outflow duct introduced into the housing leads off and opens out on the outside of the housing.

2. The power converter arrangement, according to claim 1, wherein:
one sealing ring is arranged closer to the cooling duct and the other sealing ring closer to the interior of the housing.

3. The power converter arrangement, according to claim 2, wherein:
the cooling liquid has a direction of flow at the transition from each of the connections to each of the mating connections; and
the sealing surfaces are each oriented respectively parallel to the direction of flow.

4. The power converter arrangement, according to claim 1, wherein:
the cooling liquid has a direction of flow at the transition from each of the connections to each of the mating connections; and
the sealing surfaces are oriented respectively orthogonally to the direction of flow.

5. The power converter arrangement, according to claim 4, wherein:
the sealing rings of the respective sealing devices lie within the same plane.

6. The power converter arrangement, according to claim 4, wherein:
the sealing rings of the respective sealing devices lie within different planes.

7. The power converter arrangement, according to claim 1, further comprising:
at least one sensor device arranged inside the housing; and
said at least one sensor device sending a sensor signal for at least a humidity in the interior of the housing and a penetration of the cooling liquid into the housing.

* * * * *